United States Patent [19]
Wilcox

[11] 4,052,682
[45] Oct. 4, 1977

[54] MULTIPLE OSCILLATOR MODULATOR CIRCUIT

[75] Inventor: Milton E. Wilcox, San Jose, Calif.

[73] Assignee: National Semiconductor Corporation, Santa Clara, Calif.

[21] Appl. No.: 724,441

[22] Filed: Sept. 20, 1976

[51] Int. Cl.² .......................... H03C 1/00; H03C 3/00
[52] U.S. Cl. ................................. 332/16 R; 325/47;
325/61; 325/156; 331/49; 331/117 R; 332/31 R; 332/31 T
[58] Field of Search ............... 332/9 R, 9 T, 16 R, 332/16 T, 31 R, 31 T, 21, 22, 23 R, 23 A, 40, 41, 48; 331/49; 325/33, 39, 40, 47, 61, 156

[56] References Cited
U.S. PATENT DOCUMENTS
| | | | |
|---|---|---|---|
| 2,840,713 | 6/1958 | Wulfsberg | 331/49 |
| 3,974,460 | 8/1976 | Hongu et al. | 332/31 T |
| 3,986,145 | 10/1976 | Hongu et al. | 332/16 T |

Primary Examiner—Siegfried H. Grimm
Attorney, Agent, or Firm—Gail W. Woodward; Willis E. Higgins

[57] ABSTRACT

A plurality of oscillator-modulator combinations is incorporated into a monolithic integrated circuit. A single pole multiple position switch is used to energize a single oscillator at a time, and a filter having a plurality of inputs and a common output is coupled to the modulator outputs. The modulators each have a common modulation input. Using this combination, a very simple switch can be used to control the modulated signal output at different carrier frequencies.

8 Claims, 2 Drawing Figures

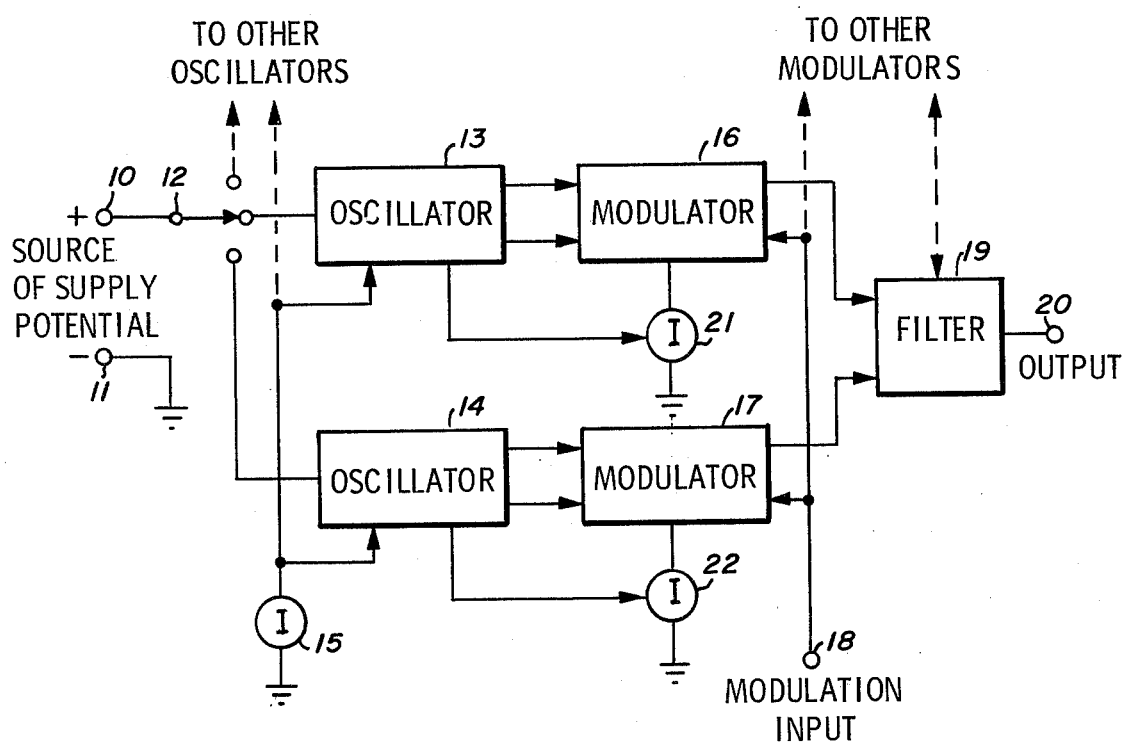
Fig_1

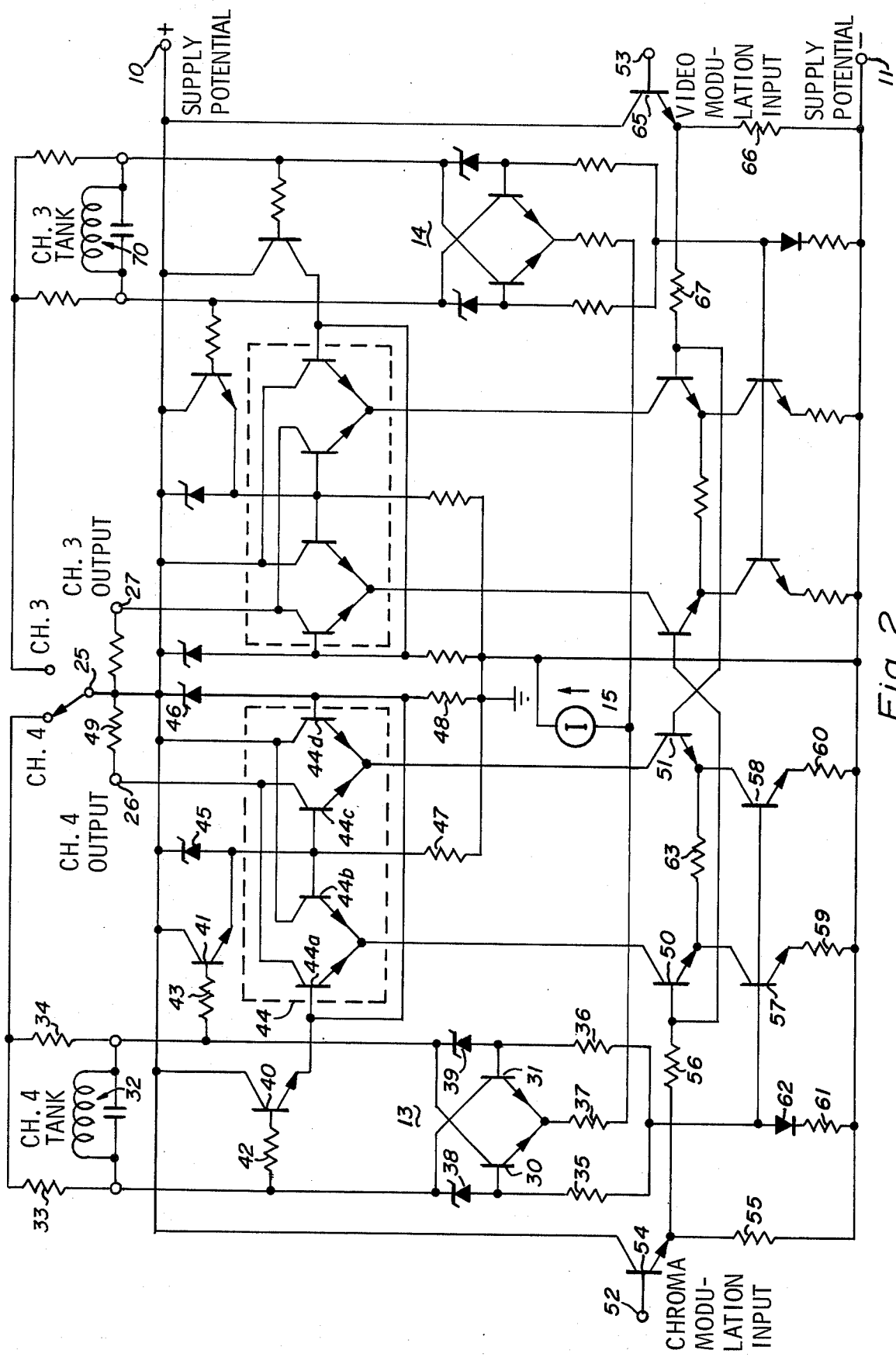
Fig_2

MULTIPLE OSCILLATOR MODULATOR CIRCUIT

BACKGROUND OF THE INVENTION

The invention has application where it is desired to switch select one of a plurality of modulated carrier signals. In the prior art it has been common to switch one of a plurality of signal sources to an output terminal. Typically, a plurality of tank-circuits, such as crystal elements, is connected to a switch and the desired one is coupled to an oscillator. The oscillator output is then fed to a modulator, the tuned circuit of which is switch selected by an element ganged to the oscillator switch. The modulator output is then made up of the modulated component of the oscillator signal. This system requires a very complex switch, which, with its attendant wiring, tends to produce spurious coupling of unwanted signals. Also the switch being remote from the tank circuits means that long signal paths must be used and this introduces stray parasitic reactances than can adversely affect the behavior of the signal circuits.

SUMMARY OF THE INVENTION

It is an object of the invention to incorporate a plurality of oscillator-modulator circuits into a monolithic integrated circuit in such a way as to permit a simple switch to select one of a plurality of output signals wherein the unused circuits do not intrude upon the operative circuit.

It is a further object of the invention to permit one of a plurality of oscillator-modulator circuits to be selected and energized to the exclusion of the others in a simple switch selected configuration adapted for monolithic circuit integration.

These and other objects are achieved in an integrated circuit that contains a separate oscillator-modulator combination for each desired signal frequency. A separate tank circuit is employed for each oscillator. A simple selector switch energizes only one oscillator of the plurality. The oscillator then drives its associated modulator. Each oscillator has a signal output that controls a current source coupled to the associated modulator, which is thereby turned off when the oscillator is not energized. The modulators all have a common modulation signal input and each one feeds a separate input of an output filter. The output filter contains a plurality of band pass elements, one tuned to each of the oscillators, and having a common output port. With this arrangement, when the selected oscillator is energized, the related modulator modulates the oscillator signal, and the output filter passes the modulated signal while rejecting those components outside the filter passband. This system permits a very simple switch to select the frequency of the modulated output signal with a minimum of spurious responses.

BRIEF DESCRIPTION OF THE DRAWING

FIG. 1 is a block diagram showing the elements of a system using the invention; and FIG. 2 is a schematic diagram showing the integrated circuit of the invention.

DESCRIPTION OF THE INVENTION

In FIG. 1 a multichannel system is shown. Two channels are detailed and provision is shown for additional oscillator-modulator combinations. As a practical matter, any reasonable number could be included and integrated into a single microcircuit chip.

A source of potential is applied between terminals 10 and 11. While not shown, this source also supplies potential to various elements within the integrated circuit. Switch 12, a single pole, multiple position switch applies operating potential to only one of the plurality of oscillators. As shown, oscillator 13 will be operative. If desired, switch 12 could be operated to energize oscillator 14 or any one of the other oscillators as indicated by the dashed lines. All of the oscillators are coupled to a common current source 15, which is designed to supply a predetermined current to whichever oscillator is energized. Each oscillator has an associated modulator connected thereto. For example, modulator 16 is coupled to oscillator 13 and modulator 17 is coupled to oscillator 14. Each modulator has a common modulation input from terminal 18 and each couples its output to a separate input of filter 19. This filter is external to the microcircuit chip because it uses either L-C tuned filters, ceramic resonators, or the equivalent. This element will be custom designed for the particular application. The function of filter 19 is to combine the outputs of the modulators into a single output on terminal 20. Filter 19 is typically a plurality of band pass elements having common outputs. Each element is tuned to accept the frequency of one of the oscillators and to pass the carrier with its attendant side band products.

Each modulator is operated from a current source. Sources 21 and 22 operate modulators 16 and 17 respectively and the sources are switched from the respective oscillators 13 and 14. When oscillator 13 is turned on by means of being associated with the active terminal of switch 12, it will in turn switch on the associated current source 21, thereby energizing modulator 16. All other oscillators and their associated modulators would therefore be deactivated. Accordingly, a very simple switch controls the entire circuit without having to switch or interrupt any signal-carrying circuits.

FIG. 2 is a schematic diagram of an integrated circuit employed to implement the functions associated with FIG. 1. Those circuit elements located above the horizontal line connected to terminal 10 are external to the microelectric IC. The circles indicate IC pads which are connected to package terminals. The circuit shown contains two oscillator-modulator combinations, only one of which is operative at a time, as determined by switch 25. Since the switch is shown in its left hand position, only the left hand portion of the schematic will be described in detail. The right hand portion operates in the same manner. In FIG. 2 the filter 19 of FIG. 1 is not shown. Its input terminals would be connected to the designated output terminals 26 and 27.

Oscillator 13 is made up of matched transistors 30 and 31 in a balanced configuration. The frequency of oscillation is set by L-C tank circuit 32. The oscillator operation is taught and claimed in my copending application Ser. No. 731,167 titled INTEGRATED CIRCUIT OSCILLATOR and filed Oct. 12, 1976.

Resistors 33 and 34 are matched and act as a balanced oscillator load. Resistors 35 and 36 are matched and act as base bias resistors. Resistor 37 couples the oscillator transistor emitters to current source 15 and acts to isolate the oscillator and prevent spurious common mode oscillation. Zener diodes 38 and 39 are matched, act as the oscillator feedback elements, and provide level shifting from collector to base. The action of this circuit is detailed in the above-identified application and will not be repeated here.

The paraphase output from oscillator 13 is applied through isolation resistors 42 and 43 to emitter follower transistors 40 and 41, which couple to balanced quad modulator 44. Transistors 44a, 44b, 44c, and 44d are connected into a quad configuration having two base inputs and a single output at terminal 26 across load resistor 49. Transistors 40 and 41 along with resistors 47 and 48 establish the quiescent bias on the base input terminals of quad 44. Zener diodes 45 and 46 are conductive when the oscillator-modulator combination is turned off as will be described hereinafter. It can be seen that as oscillator 13 alternately switches transistors 40 and 41, the quad input terminals are alternately pulled toward the positive supply potential at terminal 10. Thus the carrier signal from oscillator 13 alternately switches the transistor pairs in quad 44. Modulation is applied to quad 44 from a pair of current sources 50 and 51.

Two modulation inputs are shown at terminals 2 and 53. Signals from terminal 52 are applied to transistor 54, which acts with resistor 55 as an emitter follower, the output of which is applied to current source 50 through isolation resistor 56. Signals from terminal 53 are applied to transistor 65, which acts with resistor 66 as an emitter follower, the output of which is applied to current source 51 through isolation resistor 67. Current sources 50 and 51 are respectively biased by constant current transistors 57 and 58 respectively. Matched resistors 59 and 60 ensure that equal currents flow in transistors 57 and 58. The actual current value is established by the value of resistor 61 and diode 62. It can be seen that parts 57 through 62 comprise a current mirror. When oscillator 13 is turned on, current will flow from the positive supply terminal 10, down through resistors 33 and 34, zener diodes 38 and 39, and resistors 35 and 36 into diode 62 and resistor 61 back to terminal 11. The potential drops across diode 62 and resistor 61 will turn on transistors 57 and 58. Thus the current flowing in diode 62 is mirrored as the currents flowing in transistors 57 and 58. Resistor 63 couples transistors 50 and 51 together and is selected in value to minimize spurious modulation products in the output of quad 44. Thus current sources 50 and 51 are modulated by signals from terminals 52 and 53 respectively. Whichever source is modulated, a portion of the modulating signal appears antiphase at the other source.

Since the operation of current source transistors 57 and 58 depended upon current flowing through diode 62, a control action is present. If switch 25 is operated to disable oscillator 13, current flow in diode 62 ceases and transistors 57 and 58 turn off. This halts current flow in transistors 50 and 51, thereby terminating operation of quad 44. Because of zener diodes 45 and 46 and resistors 47 and 48, the bases of quad 44 will be held at a fixed potential and the emitters of transistors 44a through 44d will float and approach this level. The emitters of transistors 50 and 51 will float at about their base potentials. Therefore, without current flow in oscillator 13, the associated modulator is inoperative.

While FIG. 2 shows two oscillators, 13 and 14, along with associated current controlled modulators, and switch 25 energizes one or the other oscillator, additional oscillator-modulator combinations could be incorporated into particular IC. The switch would be designed to have one position per oscillator.

EXAMPLE

An IC designed as shown in FIG. 2 was constructed. The following parts list details the associated values. While only half of the parts are itemized, the parts on the second (right hand) half of the circuit are identical. The transistors are all similar and where desired are fabricated in side by side matched pairs. The diodes shown are either zener diodes reverse biased or they constitute forward biased emitter base transistor diodes.

| Part Designation | Value |
|---|---|
| Current Source 15 | 2 ma |
| Tank 32 | TV Channel 4 Video Carrier (67.25 mhz) |
| Resistor 33 | 240 ohms |
| Resistor 34 | 240 ohms |
| Resistor 35 | 2.7K ohms |
| Resistor 36 | 2.7K ohms |
| Resistor 37 | 1K ohms |
| Zener Diode 38 | 5.6 volts |
| Zener Diode 39 | 5.6 volts |
| Resistor 42 | 250 ohms |
| Resistor 43 | 250 ohms |
| Zener Diode 45 | 7 volts |
| Zener Diode 46 | 7 volts |
| Resistor 47 | 10K ohms |
| Resistor 48 | 10K ohms |
| Resistor 49 | 75 ohms |
| Resistor 55 | 10K ohms |
| Resistor 56 | 250 ohms |
| Resistor 59 | 220 ohms |
| Resistor 60 | 220 ohms |
| Resistor 61 | 100 ohms |
| Diode 62 | (emitter-base diode) |
| Resistor 63 | 3.6K ohms |
| Resistor 66 | 10K ohms |
| Resistor 67 | 250 ohms |
| Tank 70 | TV Channel 3 Video Carrier (61.25 mhz) |

A 15 volt supply was coupled to terminals 10 and 11. The input terminals 53 and 52 were fed video and chroma subcarrier signals and the modulated signals coupled to the antenna terminals of a conventional color TV receiver. The TV screen portrayed the video and color modulation information and the circuit could be switched to either channel 3 or channel 4, using only the simple SPDT switch shown at 25. The modulation of the carrier was adequate on each output channel and spurious modulation products acceptably low. There was no detectable channel 3 output when the switch was positioned as shown.

the invention has been described and a particular example detailed to show an application to television carrier modulation. It is clear that alternatives and equivalents will occur to a person skilled in the art. Therefore it is intended that the invention be limited only by the following claims.

We claim:

1. A multiple oscillator modulator circuit suitable for construction in integrated circuit form and for generating one of a plurality of possible carrier signals and for impressing upon said one carrier a modulation signal wherein the switching of said one of said plurality of possible carrier signals is achieved without switching signal carrying currents, said circuit comprising:

means for coupling said circuit to a source of operating potential;

a plurality of oscillators;

switch means coupled between each oscillator of said plurality and said source of operating potential, said switch means operating to connect any single one of said plurality of oscillators at a time to said source of operating potential;

a plurality of modulators, one for each oscillator of said plurality of oscillators, said plurality of modulators being coupled in common to a modulating signal terminal adapted for coupling to a source of modulating signals, each of said modulators being coupled to an associated oscillator for the application of oscillator signal to said modulators, and each of said modulators including a separate source of current; and means for controlling said separate source of current in response to the current flowing in said associated oscillator whereby said modulator is turned off when said oscillator is not energized.

2. The circuit of claim 1 including filter means coupled between each modulator and a signal output terminal, said filter means having the characteristic of passing said oscillator signals along with the modulation products impressed thereon by said modulators.

3. The circuit of claim 1 wherein a common source of current is coupled to said oscillators, said source being selected to produce a current value suitable for energizing a single oscillator.

4. The circuit of claim 1 wherein said switch means comprise a single pole multiple position switch whereby said source of operating potential is connected to only one of said oscillators at a time.

5. The circuit of claim 4 wherein said modulators comprise transistor quads.

6. The circuit of claim 5 wherein said modulators are driven in paraphase from said oscillators.

7. The circuit of claim 6 wherein each said quad is operated in conjunction with a current source, said current source including means for control responsive to current flow in said associated oscillator whereby said modulator is energized only when said associated oscillator is energized.

8. The circuit of claim 7 wherein a current mirror is employed to reflect current flowing in said oscillator into said quad.

* * * * *